United States Patent [19]

Okazawa

[11] Patent Number: 5,675,163

[45] Date of Patent: Oct. 7, 1997

[54] NON-VOLATILE SEMICONDUCTOR MEMORY DEVICE WITH THIN INSULATION LAYER BELOW ERASE GATE

[75] Inventor: Takeshi Okazawa, Tokyo, Japan

[73] Assignee: NEC Corporation, Japan

[21] Appl. No.: 547,247

[22] Filed: Oct. 24, 1995

[30] Foreign Application Priority Data

Oct. 26, 1994 [JP] Japan ................... 6-260845

[51] Int. Cl.$^6$ .................... H01L 27/115; H01L 29/788
[52] U.S. Cl. .................... 257/320; 257/321; 257/322; 257/316; 365/85.26
[58] Field of Search ................... 257/320, 321, 257/322, 316; 365/185.29

[56] References Cited

U.S. PATENT DOCUMENTS 5,099,297  3/1992  Hazani ................... 257/322
5,229,632  7/1993  Yoshikawa ................... 257/320
5,554,553  9/1996  Harari ................... 257/320

FOREIGN PATENT DOCUMENTS 62-137863  6/1987  Japan.
2-354  1/1990  Japan.

Primary Examiner—Jerome Jackson

[57] ABSTRACT

A non-volatile semiconductor memory device capable of effectively avoiding leak current and whereby avoiding malfunction upon reading out of a data, maintains an erasure gate electrode stacked on a floating gate, at a given potential, such as a grounding potential, when a charge is injected into the floating gate. A thickness of an isolation layer at a portion located beneath the erasure gate electrode and at a side edge portion of a channel to be thinner than the remaining portion. Thus, a current flowing in the vicinity of the interface between the isolation layer and the silicon substrate can be controlled to prevent the leak current from occurring. Therefore, it becomes unnecessary to preliminarily introduce the impurity below the isolation layer to avoid lowering of the withstanding voltage of the PN junction of the N-type diffusion layer of the source and the drain.

20 Claims, 6 Drawing Sheets

NON-VOLATILE SEMICONDUCTOR MEMORY DEVICE WITH THIN INSULATION LAYER BELOW ERASE GATE

BACKGROUND OF THE INVENTION

1. Field of the Invention

The present invention relates generally to a non-volatile memory device. More specifically, the invention relates to an electrically rewritable non-volatile memory device.

2. Description of the Related Art

Among electrically rewritable non-volatile memory devices (hereinafter referred to as "EEPROM"), the device having a plurality of storage elements (hereinafter referred to as "memory cell") and having a function for erasing all of the memory cells simultaneously is called a flash type memory (flash memory).

A stacked gate type structure as one example of the memory cell serving as base unit of this type of storage device or memory device is discussed with reference to FIGS. 5A to 5C. FIG. 5A is a plan view of the memory cell, FIG. 5B is a section taken along a line A—A in FIG. 5A and FIG. 5B is a section taken along a line B—B in FIG. 5C.

As shown in FIGS. 5A to 5C, the memory cell has the following construction.

Namely, on the surface of a P-type silicon substrate 1, N-type impurity is doped to form a source 11 and a drain 10. An element region 6 is formed between the source 11 and the drain 10 and extending thereacross. On the surface of the element region 6, a gate insulation layer 2 in a thickness of approximately 20 nm is provided. On the other hand, between the element region 6 and adjacent element region (not shown), an isolation layer in a thickness of approximately 500 nm is formed on the surface. On the gate insulation layer of the element region 6, a floating gate electrode 3 of a polycrystalline silicon is formed. On the floating gate electrode 3, a floating gate oxide layer 4 is formed in a thickness of approximately 30 nm. On the floating gate oxide layer 4, a control gate electrode 5 is formed.

On the surface of the floating gate electrode 3 not covered with the control gate electrode, an erasure insulation layer 14 is formed in a thickness of approximately 40 nm. In contact with the erasure insulation layer 14 and with covering the floating gate electrode 3, an erasure gate electrode 8 is formed.

In the construction illustrated in FIG. 5A, namely, in the structure where the element region 6 is provided between the source 11 and the drain 10 in a manner bridging therebetween and the floating gate 3 is formed thereon, a current between the source 11 and the drain 10 as viewed from the control gate electrode 5 can be varied by accumulating electron in the floating gate 3. By this, storing operation becomes possible. A minimum unit having the source, the drain, the element region, the floating gate electrode and the control gate electrode is called as a memory cell transistor (hereinafter referred to as "memory cell").

In the non-volatile semiconductor memory device, in which the memory cells of such structure are arranged in a form of matrix, the control gate electrode 5 and the erasure gate electrode 8 are arranged in parallel, and the source 11 and the drain 10 are arranged to be transverse to the control gate electrode 5 and the erasure gate electrode 8. On the other hand, in the practical non-volatile semiconductor memory device, the control gate electrode is frequently used as a word line and the drain 10 is frequently used as a bit line.

In general, storing operation in the memory cell is performed by varying a threshold value state of a memory transistor between a low threshold value state (approximately 2V) and a high threshold value state (approximately 7V). For example, the low threshold value state may be a erasing state and the high threshold value state may be a writing state.

In order to realize the writing state of the memory cell, the source 11, the erasure gate electrode 8 and the silicon substrate are set at 0V (grounding potential), the control gate electrode 5 is applied 12V, and the drain 10 is set at 5V, for example. In this case, the threshold voltage of the memory cell is approximately 2V. Then, when a capacity coupling ratio of the floating gate electrode 3 as viewed from the control gate electrode 5 is in the extent of 0.5, a channel current may flow between the source 11 and the drain 10.

A part of the electron of the channel current becomes hot state having energy greater than or equal to 3 eV and injected into the floating gate electrode 3 beyond an energy barrier of the gate insulation layer 2. By injecting the electron into the floating gate electrode 3, a threshold voltage of the memory cell is shifted in the positive direction. Then, the threshold voltage which is initially 2V, is risen to be approximately 7V higher than or equal to power source voltage. Upon reading out the data, a voltage in the extent of 5V corresponding to the power source voltage, is applied to the control gate electrode 5 of the memory cell. When the memory cell is in the writing state, the memory cell is not become conductive state.

On the other hand, in order to realize erasing state from the writing state of the memory cell, the silicon substrate 1, the source 11, the drain 10 and the control gate electrode 5 are all set at 0V (grounding potentia), and approximately 20V is applied only to the erasure gate electrode 8. In this case, on the erasure insulation layer 14 between the erasure gate electrode 8 and the floating gate 3 of the memory cell, approximately 20V of potential difference is applied. Then, through the erasure insulation layer 14, the electron is discharged from the floating gate to the erasure gate electrode 8.

As a result of withdrawal of the electron from the floating gate electrode 3, the potential of the floating gate is risen to the positive level. Therefore, the threshold value of the memory cell is shifted in the negative direction. The threshold value of the memory cell after erasure is lowered to be normal 2V, as set forth above.

In the conventional non-volatile semiconductor memory device as set forth above, the electron is injected into the floating gate utilizing the channel current flowing through the element region between the source and drain, upon writing in the memory cell. However, since the electron is injected into the floating gate electrode beyond the energy barrier of the gate insulation layer as set forth above, it becomes necessary to have the electron in the hot state having energy greater than or equal to 3 eV. The generation rate of such electron in the hot state is quite low in the extent of 0.001 to 0.01%.

Furthermore, as a factor determining the generation probability, the channel current of the memory cell is particularly important. If predetermined value of the channel current cannot be obtained, writing in the memory cell becomes insufficient. Insufficiency of the writing in the memory cell means not rising of the memory threshold after writing to the sufficient value. This can be a cause of malfunction upon reading of the data.

As causes of fluctuation, such as lowering of the channel current upon writing, most typical cause should be a leak current from other memory cells. The leak current path will be discussed with reference to FIGS. 6A, 6B and 6C. FIG. 6A is a plan view showing a path of the leak current on the surface of the isolation region, as one of the leak current of the memory cell. FIG. 6B is a section taken along a line A—A of FIG. 6A, and FIG. 6C is a section taken along a line B—B of FIG. 6A. In FIGS. 6A to 6C, the like portions to FIGS. 5A to 5C will be represented by like reference numerals.

In FIG. 6A, a current IC flowing in a channel region 9 (hatched portion) is a channel current. This is a current flowing only element region 6 in FIG. 6A shown in FIG. 6B. On the other hand, the leak current IL flows in the isolation region adjacent the element region 6 instead of the element region 6 as shown in FIG. 6B. Namely, as shown in FIG. 6C, the leak current IL normally flows the surface of the silicon substrate 1 below the isolation layer 7, and more accurately, in the vicinity of interface between the isolation layer 7 and the silicon substrate 1.

As a result of flow of the leak current IL, the channel current IC flowing in the channel region 9 is reduced, and number of electron in the hot state to be generated becomes smaller. Therefore, the memory threshold after writing cannot be risen sufficiently to be a cause of malfunction upon reading out of the data.

The cause of the leak current IL is extension of depletion layer from the drain 10 by lowering of concentration of the silicon substrate in the vicinity of interface upon formation of the high temperature thermal oxidation of the isolation layer 7.

As a solution for this, it is a typical method to preliminarily introduce impurity having the same conductive type (P-type) to the silicon substrate below the isolation layer 7. However, in this case, the impurity contacts with the N-type diffusion layer of the source 11 and the drain 10 to lower withstanding voltage of the PN junction of the N-type diffusion layer of the source 11 and the drain 10.

On the other hand, Japanese Unexamined Patent Publication (Kokai) No. Showa 62-137863 and Japanese Unexamined Patent Publication (Kokai) No. Heisei 2-354 disclose technology for reducing leak current, as known technology. These are related to the memory cells in trench structure, and cannot be applied to the memory cell in the stack gate type structure.

SUMMARY OF THE INVENTION

The present invention is worked out for solving the above-mentioned defect. Therefore, it is an object of the present invention to provide a non-volatile semiconductor memory device, which can effectively prevent leak current and thus prevent malfunction upon reading of data.

According to the first aspect of the invention, a non-volatile semiconductor memory device including a plurality of memory cells, each of the memory cells comprises:

a floating gate electrode;

an erasure gate electrode stacked on the floating gate electrode and holding a predetermined potential upon injection of charge into the floating gate electrode; and an isolation layer having a thinner thickness at a portion beneath the erasure gate and at a side edge portion of a channel than that in the remaining portion.

It is preferred that the thickness of the isolation layer at the side edge portion of the channel is approximately 10% of that in the remaining portion.

According to the second aspect of the invention, a non-volatile semiconductor memory device comprises:

first and second memory cells having floating gates formed on a substrate;

an erasure gate electrode bridging between the first and second memory cells and holding a given potential upon injection of a charge into the floating gate electrode; and an isolation layer including a portion located between the memory cells and having thinner thickness than that in the remaining portion.

According to the third aspect of the invention, a non-volatile semiconductor memory device including a plurality of memory cells, each of the memory cells comprising a floating gate electrode, an erasure gate electrode stacked on the floating gate electrode and holding a predetermined potential upon injection of charge into the floating gate electrode and an isolation layer having a thinner thickness at a portion beneath the erasure gate and at a side edge portion Of a channel than that in the remaining portion, which is fabricated through a process comprising:

a first step of forming a floating gate electrode on a substrate;

a second step of providing an isolation layer having a portion thinner in thickness than the remaining portion and located at the side edge portion of a channel, with taking the floating gate as a mask; and a third step of stacking an erasure electrode which is held at a grounding potential upon injection of a charge into the floating gate, on the floating gate electrode and the isolation layer.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIGS. 1A to 1C show a construction of a memory cell in the first embodiment of a non-volatile semiconductor memory device according to the present invention, in which FIG. 1A is a plan view of the memory cell, FIG. 1B is a section taken along a line A—A of FIG. 1A, and FIG. 1C is a section taken along a line C—C of FIG. 1A;

FIGS. 5A to 5C show the construction of the memory cell of the conventional non-volatile semiconductor memory device, in which FIG. 5A is a plan view of the memory cell, FIG. 5B is a section taken along a line A—A in FIG. 5A and FIG. 5C is a section taken along a line B—B in FIG. 5A; and FIGS. 6A to 6C show a current path in the memory cell of the conventional non-volatile semiconductor memory device, in which FIG. 6A is a plan view showing a path of the leak current on the surface of the isolation region, as one of the leak current of the memory cell. FIG. 6B is a section taken along a line A—A of FIG. 6A, and FIG. 6C is a section taken along a line B—B of FIG. 6A.

DESCRIPTION OF THE PREFERRED EMBODIMENTS

The present invention will be discussed hereinafter in detail in terms of the preferred embodiments, with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order not to obscure the present invention.

Figure 1A:
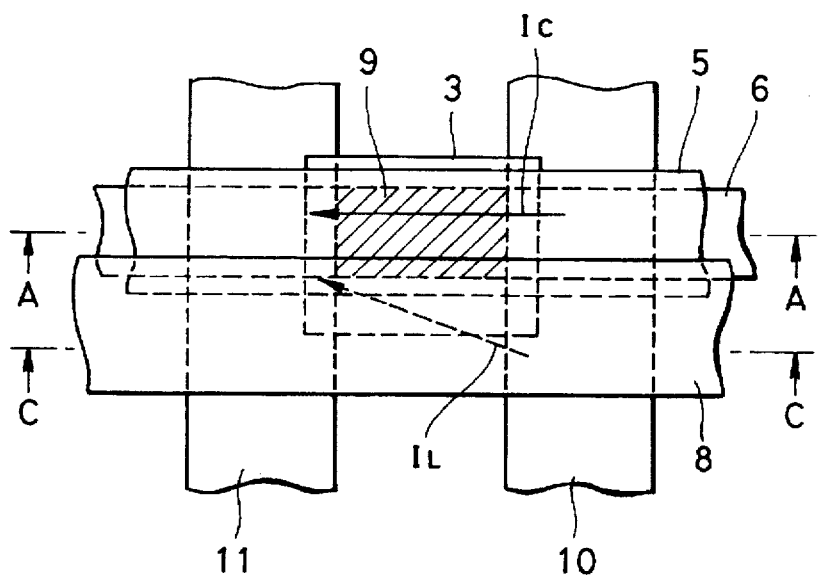
Figure 1B:
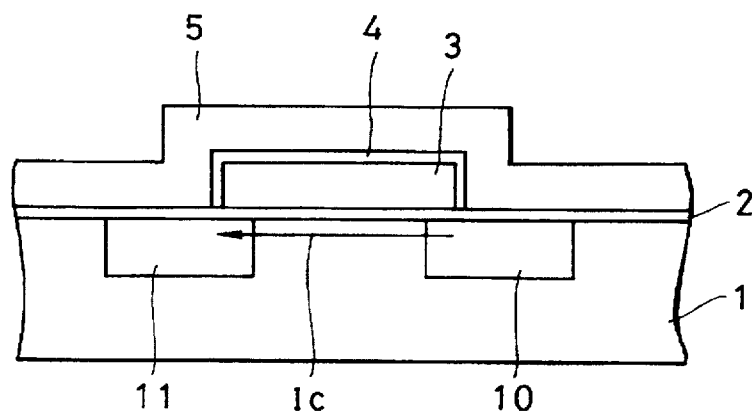
Figure 1C:
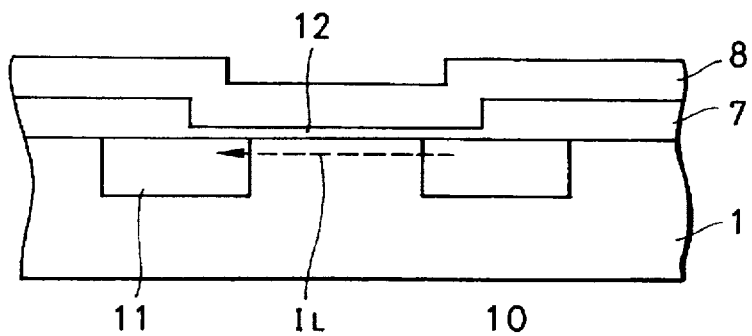

Referring now to the drawings, FIGS. 1A to 1C show a construction of a memory cell in the first embodiment of a non-volatile semiconductor memory device according to the present invention, in which FIG. 1A is a plan view of the memory cell, FIG. 1B is a section taken along a line A—A of FIG. 1A, and FIG. 1C is a section taken along a line C—C of FIG. 1A. It should be noted that, in FIGS. 1A to 1C, like elements to those in the conventional non-volatile semiconductor memory device as illustrated in FIGS. 5A to 6C will be represented by like reference numerals.

In FIGS. 1A and 1B, the source 11 and the drain 10 are formed on the surface of the P-type silicon substrate 1 by doping N-type impurity. Between the source 11 and the drain 10, the element region 6 transversely extends. On the surface of the element region 6, a gate insulation layer 2 in a thickness of approximately 20 nm is formed. On the other hand, between the element region 6 and another adjacent element region, an isolation layer 7 in a thickness of approximately 500 nm is provided.

In the first embodiment, as shown in FIG. 1C, for a portion between the element region 6 and the adjacent element region, the isolation layer 7 in a thickness of approximately 500 nm is removed. In the portion where the isolation layer 7 is removed, an isolation layer 12 of a silicon oxide in a thickness of 50 nm (which is approximately 10% of the thickness isolation layer 7) is formed, in place of the thickness isolation layer 7.

Namely, the shown embodiment is constructed, in the memory cell having the floating gate electrode and the erasure gate electrode stacked on the floating gate electrode, by providing a thinner thickness for the isolation layer at the position below the erasure gate electrode and at the side edge portion of the channel than at the other portion of isolation layer. For example, the thickness of the isolation layer below the erasure gate electrode and at the side edge portion of the channel is approximately 10% of the thickness of the isolation layer at its other portion. When the charge is injected in the floating gate electrode (upon writing), by maintaining the erasure gate electrode at the grounding potential, the occurrence of leakage current can be prevented.

On the other hand, as shown in FIG. 1B, the floating gate electrode 3 of polycrystalline silicon is formed on the gate insulation layer 2 of the element region 6. Also, on the floating gate electrode 3, the floating gate insulation layer 4 is formed in a thickness of approximately 30 nm. The control gate electrode 5 is formed on the floating gate insulation layer 4.

Then, on the surface of the floating gate electrode 3 not covered with the control gate electrode 5, the erasure insulation layer is formed in a thickness of approxinately 40 nm. In contact with the erasure insulation layer and with covering the floating gate electrode 3, the erasure gate electrode 8 is formed.

As set forth, the structure of the portion of the channel region 9 is the same as that in the conventional memory cell.

Also, similarly to the conventional memory cell, in the non-volatile semiconductor memory device, in which the memory cells having the construction set forth above are arranged in a form of matrix, the control gate electrode 5 and the erasure gate electrode 8 are arranged in parallel to each other, and the source 11 and the drain 10 are arranged in transverse to the control gate electrode 5 and the erasure gate electrode 8. Furthermore, similarly to the prior art, in the practical non-volatile semiconductor memory device, the control gate electrode 5 forms the word line and the drain 10 forms the bit line.

Next, a fabrication process of the shown embodiment of the memory cell will be discussed. FIGS. 2A to 2D and FIG. 3 show respective steps in the memory cell fabrication process according to the invention.

Figure 2A:
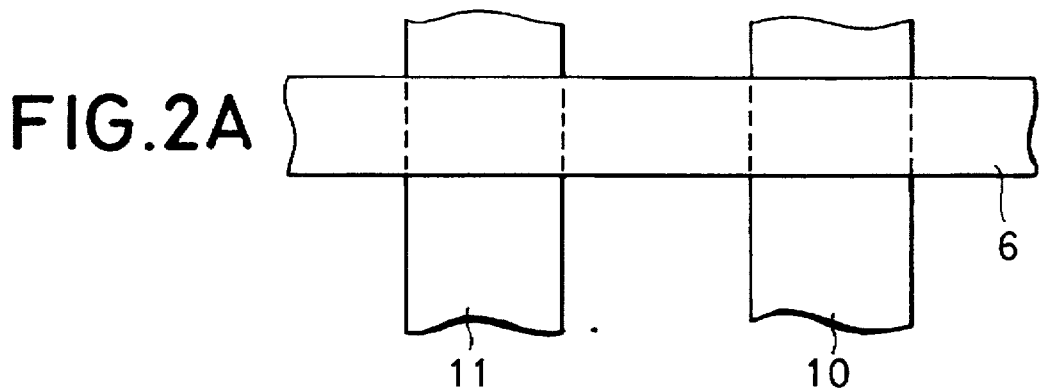
FIGS. 2A to 2D are plan views respectively showing respective steps in fabrication process of the memory cell of the non-volatile semiconductor memory device of FIGS. 1A to 1C.

At first, as shown in FIG. 2A, on the surface of the P-type silicon substrate containing impurity in the concentration of $10^{16}$ to $10^{17}$ cm$^{-3}$, N-type diffusion layer regions to be the source 11 and the drain 10 are formed. Subsequently, the element region 6 is formed bridging the source region 11 and the drain region 10. On the surface of the element region 6, the gate insulation layer of silicon oxide, for example is formed in a thickness of 20 nm. In the isolation region adjacent the element region 6, the isolation layer of silicon oxide, for example, is formed in the thickness of 500 nm.

Figure 2B:
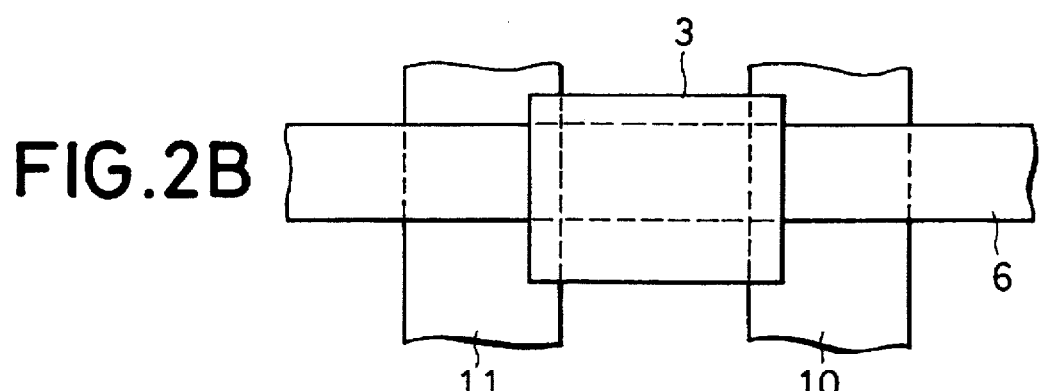

Next, the floating gate electrode 3 of polycrystalline silicon is formed in the thickness of 150 nm, with contacting the surface of the gate insulation layer of the element region 6 formed bridging the source 11 and the drain 10 of the memory cell, as shown in FIG. 2B.

Also, the floating gate insulation layer is formed over the surface of the floating gate electrode 3. Covering the floating gate insulation layer, the control gate electrode of polycrystalline silicon is formed in the thickness of 250 nm in the orientation transverse to the source 11 and the drain 10, as shown in FIG. 2C.

Next, employing a photoresist, a portion of the isolation layer adjacent the floating gate electrode 3 of the memory cell and located between the source 11 and the drain 10, is cut out. Namely, the isolation layer is partially removed as shown by hatched area. Subsequently, on the surface of the silicon substrate at the cut out portion, the isolation layer 12 of silicon oxide, for example is formed in the thickness of 50 nm, as shown in FIG. 2D.

Figure 3:
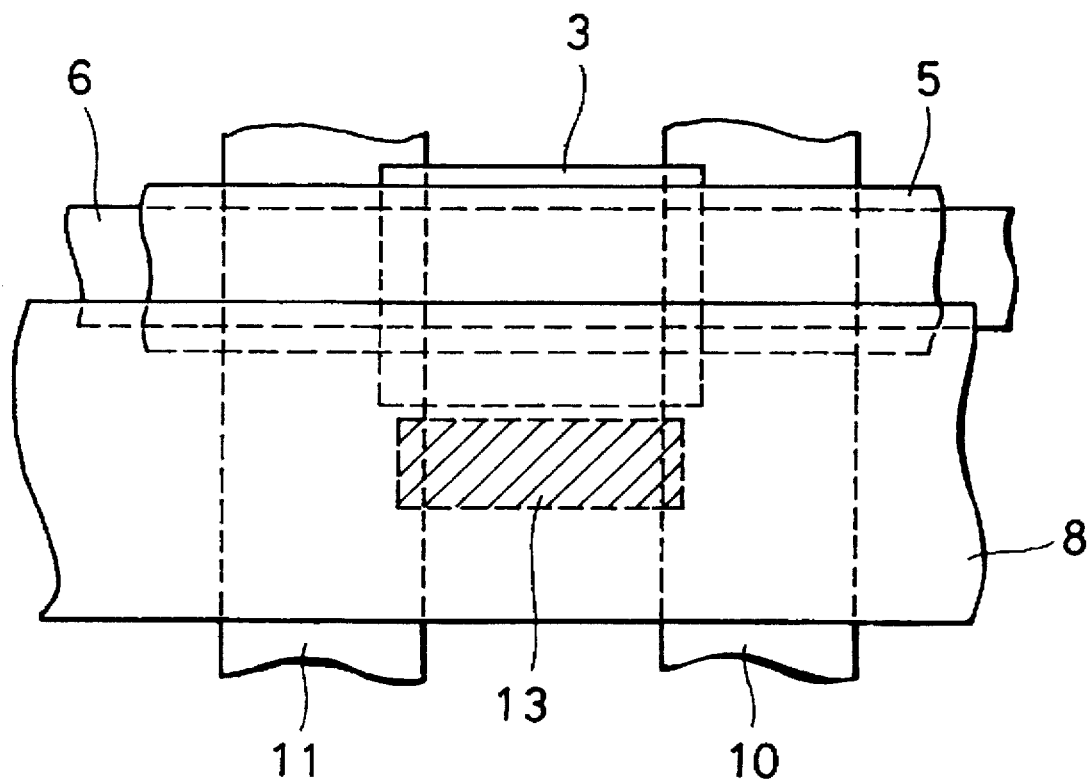
FIG. 3 is an illustration showing a final step in the memory cell fabrication process of the non-volatile semiconductor memory device of FIG. 1.

Finally, as shown in FIG. 3, the erasure gate electrode 8 is formed on the isolation layer including the isolation layer 12. This condition corresponds to the condition shown in FIG. 1A.

Figure 2C:
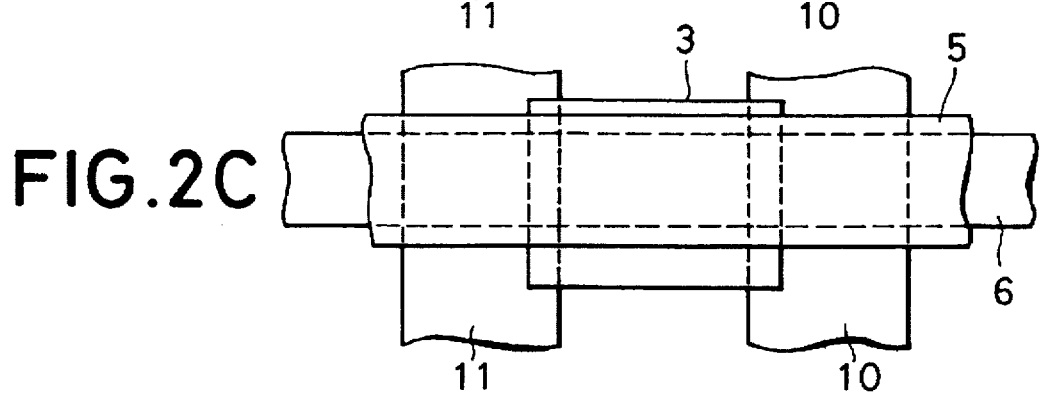
Figure 2D:
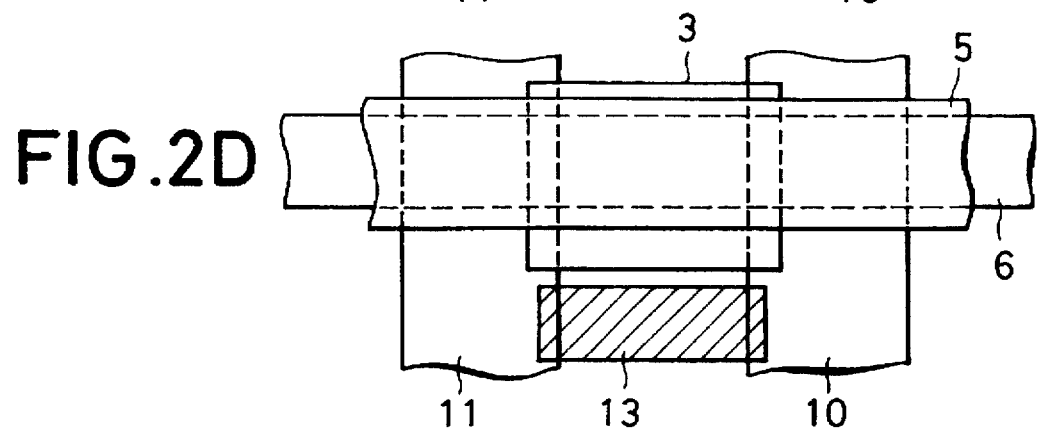
Figure 6A:
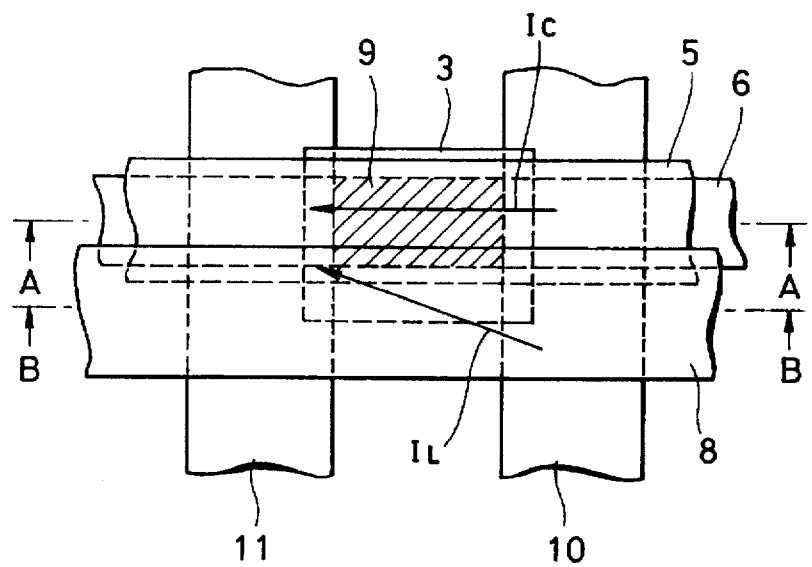
Figure 6B:
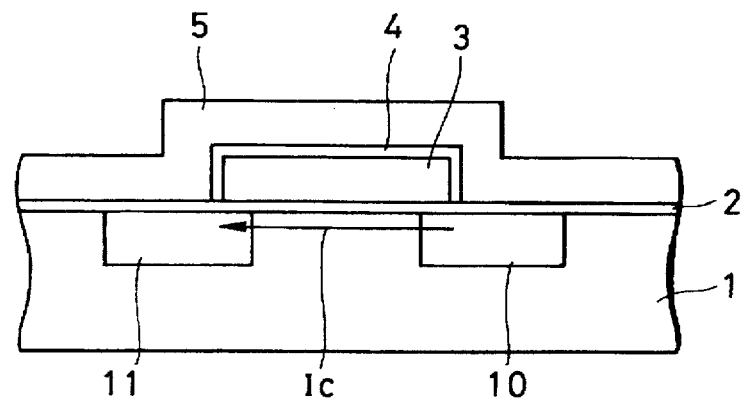
Figure 6C:
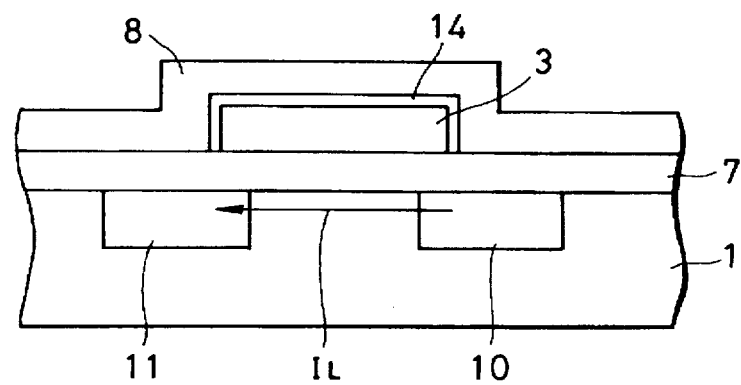

Here, with reference to FIGS. 2B and 2C, the channel region, section of which is shown in FIG. 2B, is similar to the conventional structure illustrated in FIG. 6B. However, the isolation layer illustrated in the section of FIG. 2C is provided thinner thickness at the position below the erasure gate electrode 8 and at the side edge portion of the channel than that in other portion. By this, upon injecting the charge to the floating gate electrode 3, if the erasure gate electrode 8 is maintained at the grounding potential, the leak current IL will never caused.

As a result of maintaining the potential at the erasure gate electrode 8 at the grounding potential during writing operation, the potential in the vicinity of the interface between the isolation layer 12 and the silicon substrate 1 in FIG. 2C is constantly set at the grounding potential. Therefore, the leak current IL, path of which is illustrated by the broken line, will never be caused. namely, by setting the potential in the vicinity of the interface between the isolation layer 12 and the silicon substrate 1 at the grounding potential, a state equivalent to the OFF condition of the MOS transistor can be formed to prevent the leak current IL from occurring.

As a result, a predetermined value of channel current can be obtained. Therefore, writing in the memory cell will never becomes insufficient. Therefore, after writing, the memory threshold value can be risen to the sufficiently high value so that malfunction will never be caused upon reading out the data.

Next, the second embodiment of the memory cell in the non-volatile semiconductor memory device according to the present invention will be discussed.

As set forth above, in the first embodiment, a part of the isolation layer 7 is cut out utilizing the photoresist, as shown in FIG. 1C to form the thinner isolation layer 12. In contrast to this, as shown in FIG. 4, in the shown embodiment, the isolation layer 13 is formed in the entire surface (hatched portion in FIG. 4) between the floating gate electrodes 23 of the adjacent memory cells.

Figure 4:
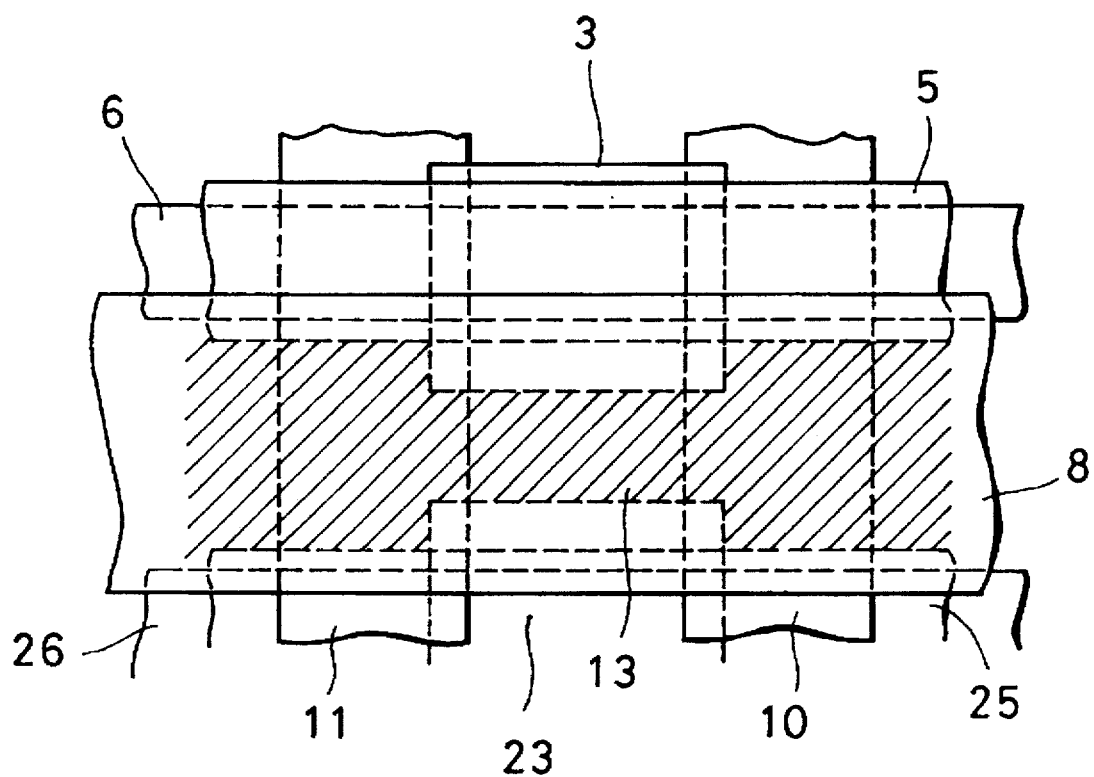
FIG. 4 is a plan view showing a construction of the memory cell in the second embodiment of the non-volatile semiconductor memory device according to the present invention.
Figure 5A:
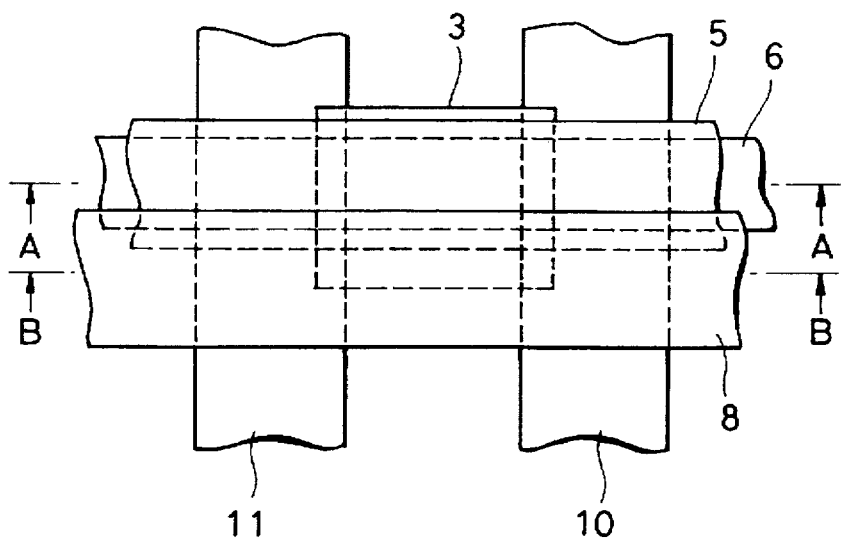
Figure 5B:
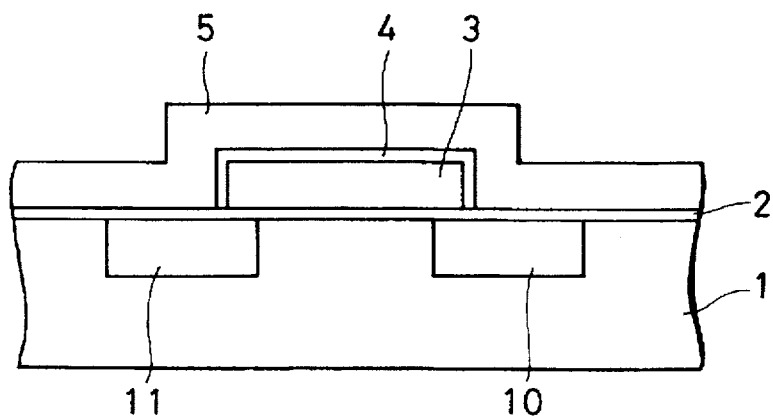
Figure 5C:
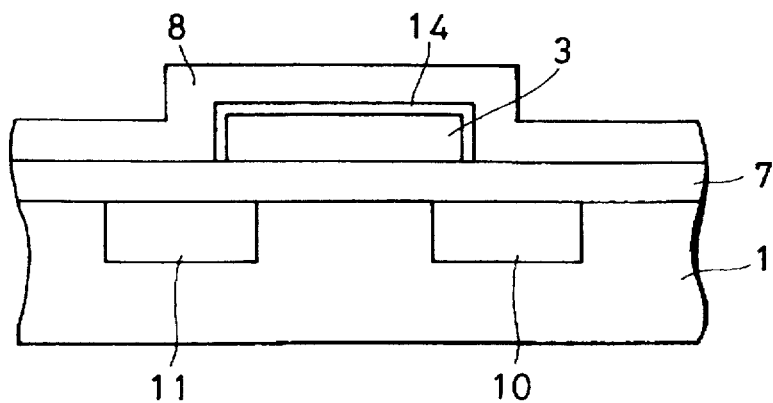

It should be noted that, in FIG. 4, the like portions to those in FIG. 1 will be represented by like reference numerals. Also, in FIG. 4, 26 denotes an element region of the adjacent memory cell, 25 denotes the control gate electrode of the adjacent memory cell.

In the second embodiment, the thickness of the isolation layer 13 is set to be comparable with the thickness of the isolation layer in FIG. 1C. The isolation layer 13 is formed with taking the floating gate electrodes 2 and 23 and the control gate electrodes 5 and 25 as masks. Namely, the isolation layer 13 is formed in self-alignment.

As set forth above, the shown embodiment of the non-volatile semiconductor memory device is fabricated through the process including the step of forming the floating gate electrode, step of providing the isolation layer having thinner thickness at the side edge portion of the channel than those of other portions with taking the floating gate electrode as the mask, the step of providing the erasure gate electrode which is to be maintained at the grounding potential while the electron is injected into the floating gate electrode stacking on the floating gate electrode and the insulation layer thereof.

As a result, the erasure gate electrode is provided over two memory cells having the floating gate electrodes formed on the substrate, and the thickness of the isolation layer formed between the memory cells becomes thinner than that at other portions. Then, similarly to the foregoing first embodiment, by maintaining the grounding potential at the erasure gate electrode upon injection of charge into the floating gate electrode, the potential in the vicinity of the interface between the isolation layer 13 and the silicon substrate can be constantly set at the grounding potential so that no leak current will be caused.

With the construction set forth above, the shown embodiment permits to neglect the step for forming the photoresist which is required in formation of the isolation layer 12 in the former embodiment. Also, it becomes possible to avoid necessity of providing a margin for aligning the mask in the step for forming the photoresist.

Namely, in the present invention, in order to prevent occurrence of the leak current, instead of preliminarily introducing impurity of the same conductivity type (P-type) to the silicon substrate below the isolation layer of the isolation region, a current flowing in the vicinity of the interface between the isolation layer and the silicon substrate utilizing the erasure gate electrode. As a result, it becomes unnecessary to preliminarily introduce the impurity below the isolation layer to avoid lowering of the withstanding voltage of the PN junction of the N-type diffusion layer of the source and the drain.

It should be noted that while the foregoing discussion has been given in terms of the case where the power source voltage is 5V, when the power source voltage other than the disclosed value is used, the values of respective layer thicknesses are naturally be varied depending upon the value of the power source voltage.

As set forth above, the present invention can effectively prevent the leak current of the memory cell from occurring by controlling the current flowing in the vicinity of the isolation layer and the silicon substrate utilizing the erasure gate electrode which is maintained at a given potential by forming the isolation layer beneath the erasure gate electrode thinner.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A non-volatile semiconductor memory device including a plurality of memory cells, each of said memory cells comprising:

a floating gate electrode;

an erasure gate electrode stacked on said floating gate electrode and holding a predetermined potential upon injection of charge into said floating gate electrode; and an isolation layer controlled by the erasure gate electrode, and having a thinner thickness at a portion beneath said erasure gate and at a side edge portion of a channel than that of a remaining portion of said isolation layer.

2. A non-volatile semiconductor memory device as set forth in claim 1, wherein the thickness of the isolation layer at the side edge portion of the channel is approximately 10% of that in the remaining portion.

3. A non-volatile semiconductor memory device comprising:

first and second memory cells having floating gates formed on a substrate;

an erasure gate electrode bridging between said first and second memory cells and holding a given potential upon injection of a charge into said floating gate electrode; and an isolation layer controlled by the erasure gate electrode, and including a portion located between said memory cells and having a thinner thickness than that of a remaining portion of said isolation layer.

4. A non-volatile semiconductor memory device as set forth in claim 1, wherein said given voltage is the grounding potential.

5. A non-volatile semiconductor memory device as set forth in claim 1, wherein a data is written in said memory cell by injecting the charge into said floating gate electrode.

6. A non-volatile semiconductor memory device as set forth in claim 1, wherein said isolation layer is of a silicon oxide.

7. A non-volatile semiconductor memory device as set forth in claim 1, wherein said floating gate electrode is formed with a polycrystalline silicon.

8. A non-volatile semiconductor memory device as set forth in claim 1, wherein said memory cell further comprises:

a control gate electrode disposed parallel to said erasure gate electrode; and a drain provided transverse to said control gate electrode and said erasure gate electrode, said control gate serving as a word line and said drain serving as a bit line.

9. A non-volatile semiconductor memory device as set forth in claim 3, wherein said given voltage is the grounding potential.

10. A non-volatile semiconductor memory device as set forth in claim 3, wherein a data is written in said memory cell by injecting the charge into said floating gate electrode.

11. A non-volatile semiconductor memory device as set forth in claim 3, wherein said isolation layer is of a silicon oxide.

12. A non-volatile semiconductor memory device as set forth in claim 3, wherein said floating gate electrode is of a polycrystalline silicon.

13. A non-volatile semiconductor memory device as set forth in claim 3, wherein said memory cell further comprises:

a control gate electrode disposed parallel to said erasure gate electrode; and a drain provided transverse to said control gate electrode and said erasure gate electrode, said control gate serving as a word line and said drain serving as a bit line.

14. A non-volatile semiconductor memory device including a plurality of memory cells, each of said memory cells having a floating gate electrode, an erasure gate electrode stacked on said floating gate electrode and holding a predetermined potential upon injection of charge into said floating gate electrode and an isolation layer controlled by the erasure gate electrode and having a thinner thickness at a portion beneath said erasure gate and at a side edge portion of a channel than that of a remaining portion of said isolation layer, which is fabricated through a process comprising:

a first step of forming a floating gate electrode on a substrate;

a second step of providing an isolation layer having a portion thinner in thickness than a remaining portion and located at the side edge portion of a channel, with said floating gate as a mask; and a third step of stacking an erasure electrode which is held at a grounding potential upon injection of a charge into said floating gate, on said floating gate electrode and said isolation layer.

15. A non-volatile semiconductor memory device as set forth in claim 14, wherein the thickness of the isolation layer at the side edge portion of the channel is approximately 10% of that in the remaining portion.

16. A non-volatile semiconductor memory device as set forth in claim 14, wherein said given voltage is the grounding potential.

17. A non-volatile semiconductor memory device as set forth in claim 14, wherein a data is written in said memory cell by injecting the charge into said floating gate electrode.

18. A non-volatile semiconductor memory device as set forth in claim 14, wherein said isolation layer is of a silicon oxide.

19. A non-volatile semiconductor memory device as set forth in claim 14, wherein said floating gate electrode is of a polycrystalline silicon.

20. A non-volatile semiconductor memory device as set forth in claim 14, wherein said memory cell further comprises:

a control gate electrode disposed in parallel to said erasure gate electrode; and a drain provided transverse to said control gate electrode and said erasure gate electrode, said control gate serving as a word line and said drain serving as a bit line.

* * * * *